(12) United States Patent
Matsumoto et al.

(10) Patent No.: US 9,506,959 B2
(45) Date of Patent: Nov. 29, 2016

(54) OPERATION SUPPORT SYSTEM AND RECORDING MEDIUM

(71) Applicant: Mitsubishi Electric Corporation, Tokyo (JP)

(72) Inventors: Takashi Matsumoto, Tokyo (JP); Hirotoshi Yano, Tokyo (JP); Toshiaki Yoshikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 553 days.

(21) Appl. No.: 14/040,871

(22) Filed: Sep. 30, 2013

(65) Prior Publication Data
US 2014/0100783 A1    Apr. 10, 2014

(30) Foreign Application Priority Data

Oct. 4, 2012    (JP) .................................. 2012-222538

(51) Int. Cl.
*G01R 21/00* (2006.01)
*G01W 1/00* (2006.01)
*H02J 3/00* (2006.01)

(52) U.S. Cl.
CPC .............. *G01R 21/00* (2013.01); *G01W 1/00* (2013.01); *H02J 3/00* (2013.01); *H02J 2003/007* (2013.01); *Y02E 60/76* (2013.01); *Y04S 40/22* (2013.01)

(58) Field of Classification Search
CPC ................................. G01W 1/00; G01R 21/00
USPC ............................................................ 702/3
See application file for complete search history.

(56) References Cited

U.S. PATENT DOCUMENTS

| 7,409,303 | B2 * | 8/2008 | Yeo ........................ G01D 4/004 |
| | | | 702/60 |
| 9,020,769 | B2 * | 4/2015 | Rada ....................... G01D 4/00 |
| | | | 702/176 |
| 2011/0282505 | A1 | 11/2011 | Tomita et al. |
| 2013/0204445 | A1 | 8/2013 | Ikeda et al. |

FOREIGN PATENT DOCUMENTS

| CN | 102138266 A | 7/2011 |
| JP | 06-229608 A | 8/1994 |
| JP | 2002-305845 A | 10/2002 |

(Continued)

OTHER PUBLICATIONS

Office Action issued Sep. 25, 2015 in the corresponding CN application No. 20131045352.5 (with partial English translation).

(Continued)

*Primary Examiner* — Bryan Bui
(74) *Attorney, Agent, or Firm* — Posz Law Group, PLC

(57) ABSTRACT

The total electric power that is supplied to a house, the electric power $P2_1$ to $P2_4$ that is consumed by electrical equipment that is used in the house, and electric power that is generated by an electric power generator 60 are automatically displayed together with weather information WR1 that indicates the weather every hour. As a result, a user is able to check the amount of electric power consumed by the electrical equipment 50 according to the weather, or check the amount of electric power that is generated according to the weather. Therefore, it is possible to efficiently operate the electrical equipment 50 according to the weather.

7 Claims, 13 Drawing Sheets

(56) References Cited

FOREIGN PATENT DOCUMENTS

| JP | 2004-227082 A | 8/2004 |
|----|---------------|--------|
| JP | 2005-316843 A | 11/2005 |
| JP | 2006-300428 A | 11/2006 |
| JP | 2008-136334 A | 6/2008 |
| JP | 2012-019579 A | 1/2012 |
| JP | 2012-090431 A | 5/2012 |
| JP | 2012-090459 A | 5/2012 |
| JP | 2012-143098 A | 7/2012 |
| JP | 2013-153567 A | 8/2013 |
| WO | 2010/140090 A1 | 12/2010 |

OTHER PUBLICATIONS

Office Action mailed Nov. 11, 2014 issued in corresponding JP patent application No. 201-222538 (and English translation).
Office Action issued Apr. 22, 2016 in the corresponding CN application No. 201310453252.5 (with partial English translation).
Extended European Search Report Issued Aug. 26, 2016 in the corresponding EP application No. 13186994.3.

* cited by examiner

FIG.6

| WR1 | ☀ | ☁ | ☁ | 🌧 | 🌧 | ☀ | ☀ | ☀ | ☁ |
|------|------|------|------|------|------|------|------|------|------|
| Dy | 2012 | | | | | | | | |
| Dm | 10 | | | | | | | | |
| Dd | 1 | | | | | 2 | | | |
| Dt | 12:00 | 13:00 | 14:00 | 15:00 | 16:00 | 0:00 | 1:00 | 2:00 | 3:00 |
| P1 | P1(1) | P1(2) | P1(3) | P1(4) | P1(5) | P1(1) | P1(2) | P1(3) | P1(4) |
| $P2_1$ | $P2_1(1)$ | $P2_1(2)$ | $P2_1(3)$ | $P2_1(4)$ | $P2_1(5)$ | $P2_1(1)$ | $P2_1(2)$ | $P2_1(3)$ | $P2_1(4)$ |
| $P2_2$ | $P2_2(1)$ | $P2_2(2)$ | $P2_2(3)$ | $P2_2(4)$ | $P2_2(5)$ | $P2_2(1)$ | $P2_2(2)$ | $P2_2(3)$ | $P2_2(4)$ |
| $P2_3$ | $P2_3(1)$ | $P2_3(2)$ | $P2_3(3)$ | $P2_3(4)$ | $P2_3(5)$ | $P2_3(1)$ | $P2_3(2)$ | $P2_3(3)$ | $P2_3(4)$ |
| $P2_4$ | $P2_4(1)$ | $P2_4(2)$ | $P2_4(3)$ | $P2_4(4)$ | $P2_4(5)$ | $P2_4(1)$ | $P2_4(2)$ | $P2_4(3)$ | $P2_4(4)$ |
| P3 | P3(1) | P3(2) | P3(3) | P3(4) | P3(5) | P3(1) | P3(2) | P3(3) | P3(4) |
| LX1 | LX1(1) | LX1(2) | LX1(3) | LX1(4) | LX1(5) | LX1(1) | LX1(2) | LX1(3) | LX1(4) |
| LX2 | LX2(1) | LX2(2) | LX2(3) | LX2(4) | LX2(5) | LX2(1) | LX2(2) | LX2(3) | LX2(4) |
| LX3 | LX3(1) | LX3(2) | LX3(3) | LX3(4) | LX3(5) | LX3(1) | LX3(2) | LX3(3) | LX3(4) |
| LX4 | LX4(1) | LX4(2) | LX4(3) | LX4(4) | LX4(5) | LX4(1) | LX4(2) | LX4(3) | LX4(4) |
| TH1 | TH1(1) | TH1(2) | TH1(3) | TH1(4) | TH1(5) | TH1(1) | TH1(2) | TH1(3) | TH1(4) |
| TH2 | TH2(1) | TH2(2) | TH2(3) | TH2(4) | TH2(5) | TH2(1) | TH2(2) | TH2(3) | TH2(4) |
| TH3 | TH3(1) | TH3(2) | TH3(3) | TH3(4) | TH3(5) | TH3(1) | TH3(2) | TH3(3) | TH3(4) |
| TH4 | TH4(1) | TH4(2) | TH4(3) | TH4(4) | TH4(5) | TH4(1) | TH4(2) | TH4(3) | TH4(4) |

FIG.7

| PAST WEATHER (WR1) | ☀ | ☁ | ☁ | 🌧 | 🌧 |
|---|---|---|---|---|---|
| YEAR | 2012 | | | | |
| MONTH | 10 | | | | |
| DAY | 1 | | | | |
| TIME | 12:00 | 13:00 | 14:00 | 15:00 | 16:00 |
| POWER CONSUMPTION | P1(1) | P1(2) | P1(3) | P1(4) | P1(5) |
| ELECTRICITY COST | Y(1) | Y(2) | Y(3) | Y(4) | Y(5) |
| POWER CONSUMPTION OF ROOM 1 | $P2_1(1)$ | $P2_1(2)$ | $P2_1(3)$ | $P2_1(4)$ | $P2_1(5)$ |
| ELECTRICITY COST OF ROOM 1 | Y1(1) | Y1(2) | Y1(3) | Y1(4) | Y1(5) |
| POWER CONSUMPTION OF ROOM 2 | $P2_2(1)$ | $P2_2(2)$ | $P2_2(3)$ | $P2_2(4)$ | $P2_2(5)$ |
| ELECTRICITY COST OF ROOM 2 | Y2(1) | Y2(2) | Y2(3) | Y2(4) | Y2(5) |

FIG.8

| PAST WEATHER (WR1) | ☀ | ☁ | ☁ | 🌧 | 🌧 |
|---|---|---|---|---|---|
| YEAR | 2012 | | | | |
| MONTH | 10 | | | | |
| DAY | 1 | | | | |
| TIME | 12:00 | 13:00 | 14:00 | 15:00 | 16:00 |
| POWER CONSUMPTION | P1(1) | P1(2) | P1(3) | P1(4) | P1(5) |
| ELECTRICITY COST | Y(1) | Y(2) | Y(3) | Y(4) | Y(5) |
| ILLUMINATION OF ROOM 1 | LX1(1) | LX1(2) | LX1(3) | LX1(4) | LX1(5) |
| TEMPERATURE OF ROOM 1 | TH1(1) | TH1(2) | TH1(3) | TH1(4) | TH1(5) |
| ILLUMINATION OF ROOM 2 | LX2(1) | LX2(2) | LX2(3) | LX2(4) | LX2(5) |
| TEMPERATURE OF ROOM 2 | TH2(1) | TH2(2) | TH2(3) | TH2(4) | TH2(5) |

FIG.11

| TIME | 1 HOUR LATER | 2 HOURS LATER | 3 HOURS LATER | ... |
|---|---|---|---|---|
| WR2 | ☀ | ☀ | 🌧 | ... |

| | | | | |
|---|---|---|---|---|
| $P2_1$ | $P2_1(AVG)$ | $P2_1(AVG)$ | $P2_1(AVG)$ | ... |
| $P2_2$ | $P2_2(AVG)$ | $P2_2(AVG)$ | $P2_2(AVG)$ | ... |
| $P2_3$ | $P2_3(AVG)$ | $P2_3(AVG)$ | $P2_3(AVG)$ | ... |
| $P2_4$ | $P2_4(AVG)$ | $P2_4(AVG)$ | $P2_4(AVG)$ | ... |

FIG.12

| TIME | 1 HOUR LATER | 2 HOURS LATER | 3 HOURS LATER | ... |
|---|---|---|---|---|
| WEATHER FORECAST (WR2) | ☀ | ☀ | ☁ | ... |
| ELECTRICAL EQUIPMENT $50_1$ | P21(AVG) | P21(AVG) | P21(AVG) | ... |
| ELECTRICAL EQUIPMENT $50_2$ | P22(AVG) | P22(AVG) | P22(AVG) | ... |
| ELECTRICAL EQUIPMENT $50_3$ | P23(AVG) | P23(AVG) | P23(AVG) | ... |
| ELECTRICAL EQUIPMENT $50_4$ | P24(AVG) | P24(AVG) | P24(AVG) | ... |

FIG.13

| TIME | 1 HOUR LATER | 2 HOURS LATER | 2 HOURS LATER | ... |
|---|---|---|---|---|
| WEATHER FORECAST (WR2) | ☀ | ☀ | ☁ | ... |
| ELECTRICAL EQUIPMENT $50_1$ | $P2_1(AVG)$ | $P2_1(AVG)$ | $P2_1(AVG)$ | ... |
| ELECTRICAL EQUIPMENT $50_2$ | $P2_2(AVG)$ | $P2_2(AVG)$ | $P2_2(AVG)$ | ... |
| ELECTRICAL EQUIPMENT $50_3$ | $P2_3(AVG)$ | $P2_3(AVG)$ | $P2_3(AVG)$ | ... |
| ELECTRICAL EQUIPMENT $50_4$ | $P2_4(AVG)$ | $P2_4(AVG)$ | $P2_4(AVG)$ | ... |
| ELECTRICITY COST OF ELECTRICAL EQUIPMENT $50_1$ | $Y_1(AVG)$ | $Y_1(AVG)$ | $Y_1(AVG)$ | ... |
| ELECTRICITY COST OF ELECTRICAL EQUIPMENT $50_2$ | $Y_2(AVG)$ | $Y_2(AVG)$ | $Y_2(AVG)$ | ... |
| ELECTRICITY COST OF ELECTRICAL EQUIPMENT $50_3$ | $Y_3(AVG)$ | $Y_3(AVG)$ | $Y_3(AVG)$ | ... |
| ELECTRICITY COST OF ELECTRICAL EQUIPMENT $50_4$ | $Y_4(AVG)$ | $Y_4(AVG)$ | $Y_4(AVG)$ | ... |

OPERATION SUPPORT SYSTEM AND RECORDING MEDIUM

CROSS-REFERENCE TO RELATED APPLICATION

This application claims the benefit of Japanese Patent Application No. 2012-222538, filed on Oct. 4, 2012, the entire disclosure of which is incorporated by reference herein.

FIELD

This application relates to an operation support system and a recording medium, and more particularly, to an operation support system and a recording medium for supporting the operation of electrical equipment.

BACKGROUND

In recent years, as a countermeasure against a drop in power supply performance due to a disaster or the like, tackling the problem with the purpose of reducing the amount of consumed energy is considered to be important. With this kind of background, various kinds of technology have been proposed for effectively advancing energy saving activity (refer to Unexamined Japanese Patent Application Kokai Publication No. 2004-227082).

The objective of the operation system that is described in Unexamined Japanese Patent Application Kokai Publication No. 2004-227082 is to increase the awareness of user of power saving and to spiral up of energy-saving activities by making it possible to visualize the power consumption of electrical equipment and the conservation effect of energy-saving activities.

SUMMARY

The operation rate of electrical equipment, and the living pattern of a user of that electrical equipment greatly changes according to changes in the temperature and humidity. Therefore, when making it possible to visualize the power consumption of electrical equipment and the operating condition, it is preferable to display in some form the environment around the dwelling unit where the electrical equipment is installed.

Taking the above situation into consideration, the objective of the present invention is to efficiently operate electrical equipment according to the weather by correlating and displaying the operating condition of the electrical equipment with weather information.

In order to accomplish the objective described above, the operation support system of the present invention is an operation support system that supports the operation of electrical equipment in a house, and has: a weather information acquirer that acquires hourly weather information by way of a network; a detector that detects the state of use of the electrical equipment that is used by a user living in the house; a memory that stores the weather information and the state of use of the electrical equipment that have been correlated over time; and a display that displays the weather information and the state of use of the electrical equipment that are stored by the memory.

BRIEF DESCRIPTION OF THE DRAWINGS

A more complete understanding of this application can be obtained when the following detailed description is considered in conjunction with the following drawings, in which:

FIG. 6 is a drawing that schematically illustrates a weather database;

FIG. 7 is a drawing illustrating a weather database that is displayed on a display device;

FIG. 8 is a drawing illustrating a weather database that is displayed on a display device;

FIG. 11 is a drawing illustrating average electric power values that are calculated for each estimated information value;

FIG. 12 is a drawing illustrating a display device that displays average electric power values; and FIG. 13 is a drawing illustrating a display device that displays the electricity cost.

DETAILED DESCRIPTION

Figure 1:
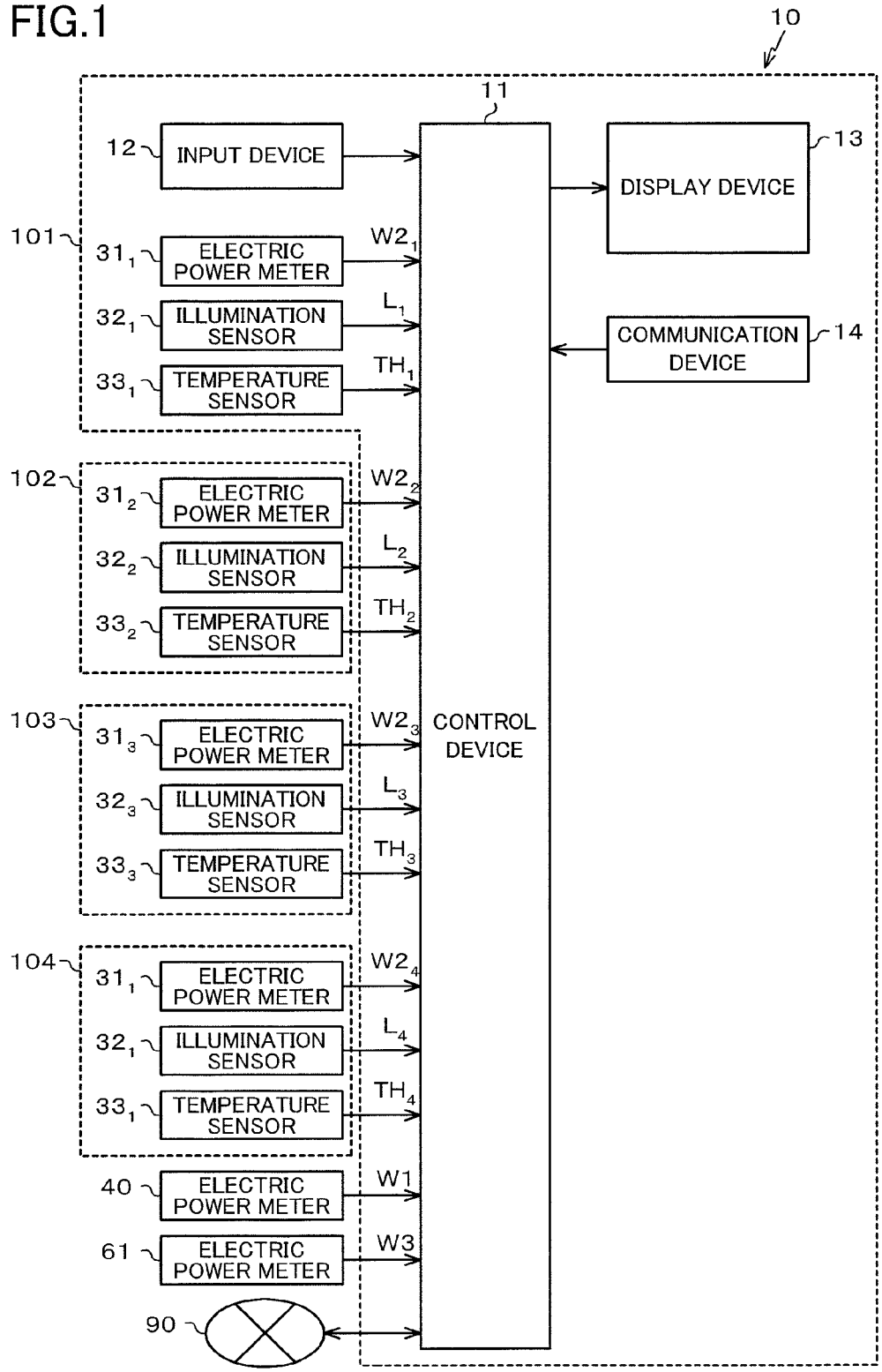
FIG. 1 is a block diagram of an operation support system.

In the following, embodiments of the present invention will be explained using the drawings. FIG. 1 is a block diagram of an operation support system 10. The operation support system 10 is a system for supporting the operation of electric equipment that is installed in a house. As shown in FIG. 1, this operation support system 10 has a control device 11, an input device 12, a display device 13, a communication device 14, electric power meters 31, 40, 61, illumination sensors 32, and temperature sensors 33.

Figure 2:
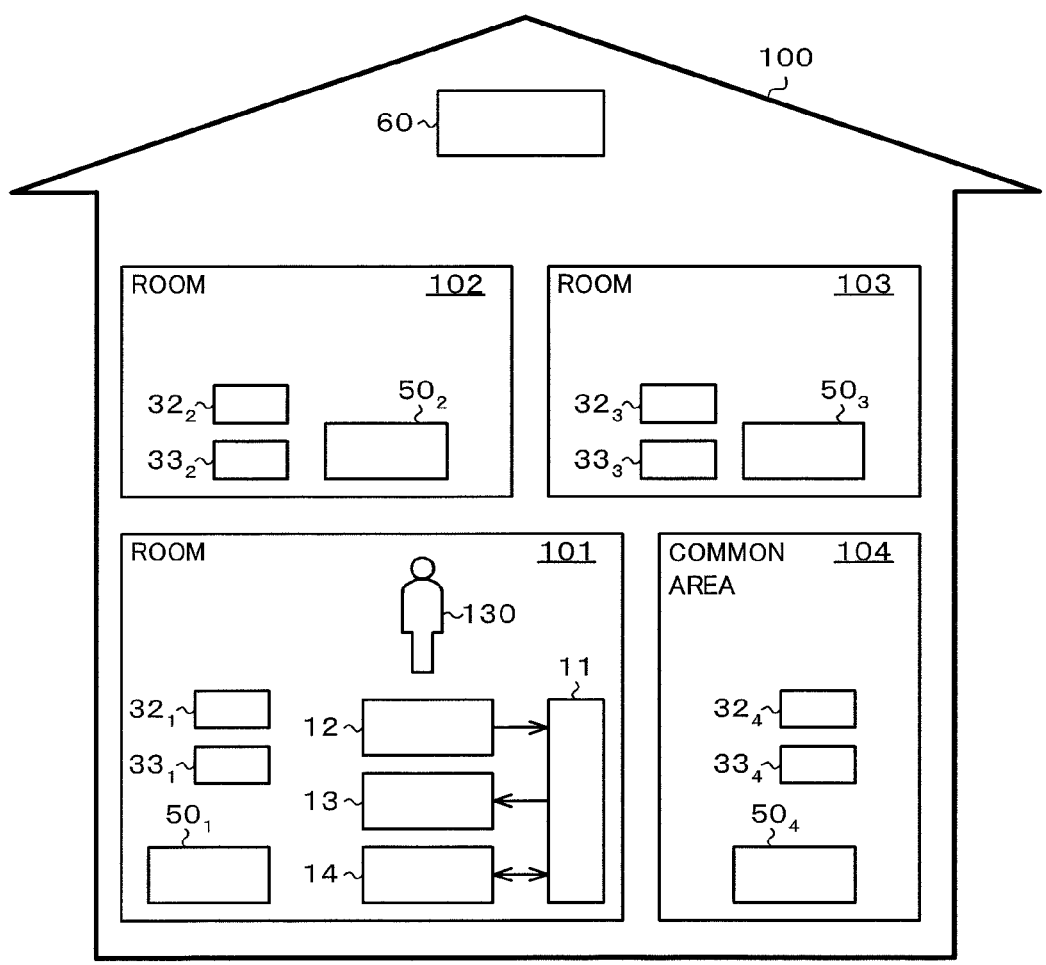
FIG. 2 is a layout drawing of an operation support system.

FIG. 2 is a layout drawing of the operation support system 10 that is installed in a house 100. As illustrated in FIG. 2, the house 100 is divided into three rooms 101 to 103, and a common area 104 such as a kitchen, a bathroom, a toilet and the like. The house 100 is divided conveniently in this way in order to explain this embodiment of the invention.

Electrical equipment $50_1$ to $50_4$ is installed in the rooms 101 to 103 and common area 104 of the house 100. The electrical equipment $50_1$ to $50_4$ is home electric appliance mainly air-conditioners, lighting and the like.

Figure 3:
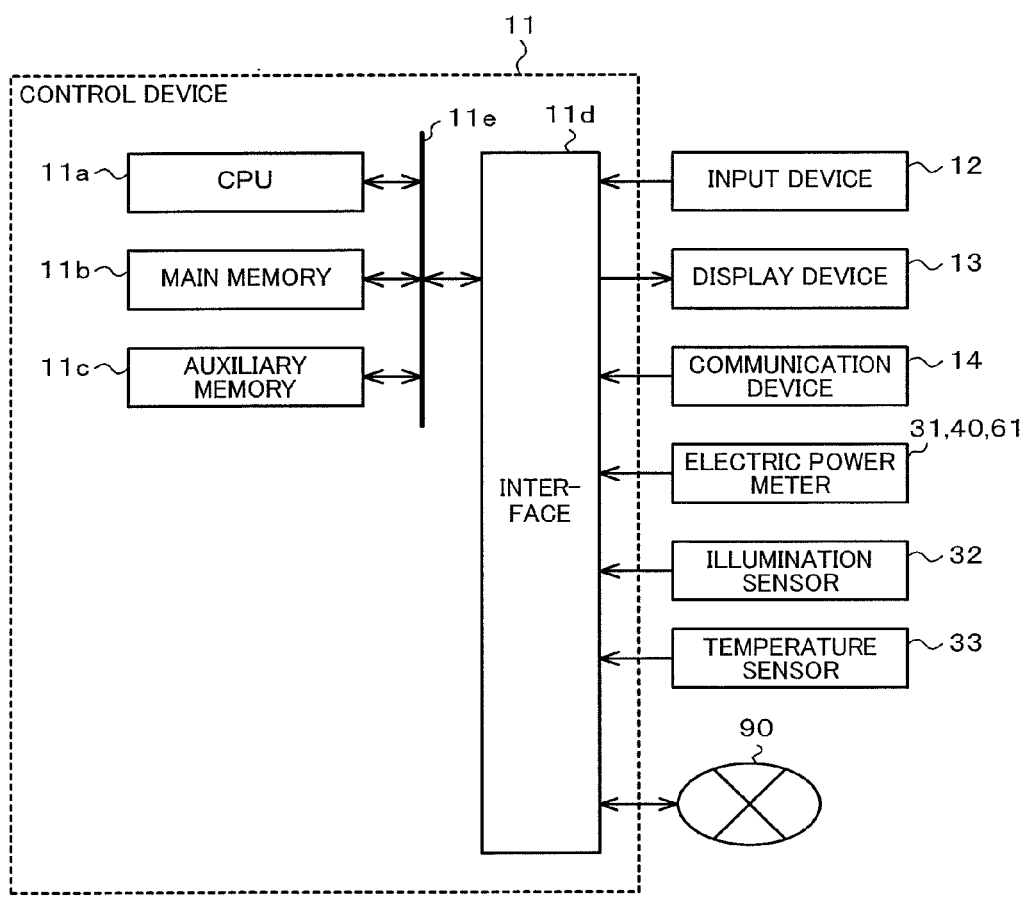
FIG. 3 is a block diagram of a control device.

The control device 11 is located in a room of the house 100, FIG. 3 is a block diagram illustrating the physical construction of the control device 11. As illustrated in FIG. 3, the control device 11 is a computer that has a CPU (Central Processing Unit) 11a, a main memory 11b and an auxiliary memory 11c.

The main memory 11b is constructed so as to include a RAM (Random Access Memory), and is used as the work area of the CPU 11a.

The auxiliary memory 11c is constructed so as to include a ROM (Read Only Memory), a magnetic disk, and a non-volatile memory such as a semiconductor memory. This auxiliary memory 11c stores programs that are executed by the CPU 11a, and various kinds of parameters.

The CPU 11a, the main memory 11b and the auxiliary memory 11c are connected mutually by a system bus 11e.

An interface 11d includes a communication interface for the Internet 90, input device 12, display device 13, communication device 14, electric power meters 31, 40, 61, illumination sensors 32, and temperature sensors 33. All of the devices above are connected to the system bus 17 by way of the interface 11d. As a result, all of the devices of the operation support system 10 are connected so as to be able to communicate with each other.

As illustrated in FIG. 2, the input device 12 is located in the room 101. The input device 12 has a user interface such as a touch panel. As can be seen in FIG. 3, instructions from a user 130 are inputted by way of this input device 12, and given to the CPU 11a by way of the system bus 11e.

As illustrated in FIG. 2, the display device 13 is installed in the room 101. The display device 13 has an LCD (Liquid Crystal Display), and displays the processing results of the control device 11 and the like. In this embodiment, a GUI (Graphical User Interface) is constructed with the input device 12 and display device 13.

Figure 4:
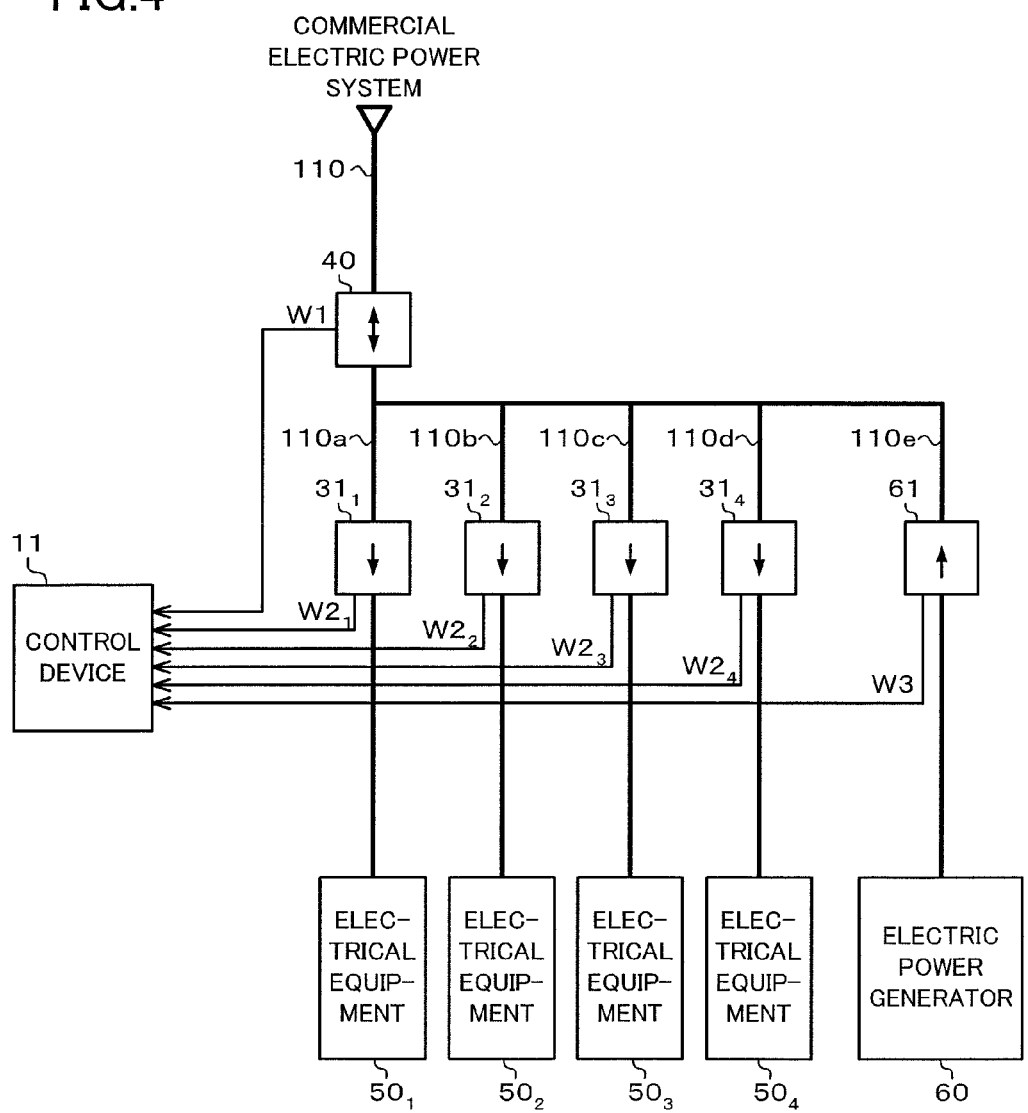
FIG. 4 is an electrical power system diagram of a house in which an operation support system is installed.

FIG. 4 is an electrical power system diagram of a house 100. As illustrated in FIG. 4, the electric power meter 40 is installed on a lead-in wire 110 that runs to the house 100 from a commercial electric power system. This electric power meter 40 measures the electric power that is supplied from the commercial electric power system to the house 100, and the electric power that flows to the commercial electric power system from the house 100. The electric power meter 40 also outputs a signal W1 having a value that corresponds to the measurement result to the control device 11.

Electric power meters 31 are provided in the branch wires 110a to 110d that run to each room 101 to 103 and common area 104. The electric power meters 31 measure the electric power that is supplied to the electrical equipment 50 by way of the branch wires 110a to 110d, and output signals according to the measurement results.

More specifically, the electric power meter $31_1$ outputs a signal $W2_1$ having a value that corresponds to the measurement result for the electric power that is supplied to the electrical equipment $50_1$ that is installed in the room 101. The electric power meter $31_2$ outputs a signal $W2_2$ having a value that corresponds to the measurement result for the electric power that is supplied to the electrical equipment $50_2$ that is installed in the room 102. The electric power meter $31_3$ outputs a signal $W2_3$ having a value that corresponds to the measurement result for the electric power that is supplied to the electrical equipment $50_3$ that is installed in the room 103. The electric power meter $31_4$ outputs a signal $W2_4$ having a value that corresponds to the measurement result for the electric power that is supplied to the electrical equipment $50_4$ that is installed in the common area 104.

The electric power meter 61 is provided on the branch wire 110e that connects the commercial electric power system and electrical equipment 50 and an electric power generator 60. The electric power meter 61 measures the electric power that is outputted from the electric power generator 60, and outputs a signal W3 having a value that corresponds to that measurement result to the control device 11.

As illustrated in FIG. 2, illumination sensors 32 are located in the rooms 101 to 103 and the common area 104 of the house 100. As can be seen from FIG. 1, the illumination sensors 32 measure the illumination intensity in the rooms 101 to 103 and common area 104, and output signals having values that correspond to the measurement results to the control device 11.

More specifically, the illumination sensor $32_1$ outputs a signal $L_1$ having a value that corresponds to the measurement result for the illumination in the room 101. The illumination sensor $32_2$ outputs a signal $L_2$ having a value that corresponds to the measurement result for the illumination intensity in the room 102. The illumination sensor $32_3$ outputs a signal $L_3$ having a value that corresponds to the measurement result for the illumination in the room 103. The illumination sensor $32_4$ outputs a signal $L_4$ having a value that corresponds to the measurement result for the illumination in the common area 104.

As illustrated in FIG. 2, temperature sensors 33 are located in the rooms 101 to 103 and the common area 104 of the house 100. As can be seen from FIG. 1, the temperature sensors 33 measure the temperature in the rooms 101 to 103 and the common area 104, and output signals having values that correspond to the measurement results to the control device 11.

More specifically, the temperature sensor $33_1$ outputs a signal $TH_1$ having a value that corresponds to the measurement result for the temperature in the room 101. The temperature sensor $33_2$ outputs a signal $TH_2$ having a value that corresponds to the measurement result for the temperature in the room 102. The temperature sensor $33_3$ outputs a signal $TH_3$ having a value that corresponds to the measurement result for the temperature in the room 103. The temperature sensor $33_4$ outputs a signal $TH_4$ having a value that corresponds to the measurement result for the temperature in the common area 104.

Next, the operation of the operation support system 10 that is constructed as described above will be explained. The operation of the operation support system 10 is divided into a database creation operation and a proposal operation. The database creation operation is an operation that creates a database for the electrical equipment 50. Moreover, the proposal operation is an operation for proposing to a user 130 the most suitable electrical equipment 50 for operation. First, a weather database creation operation that is executed by the control device 11 will be explained with reference to FIG. 5. The processing described above is achieved by the CPU 11a of the control device 11 executing a program that is stored in the auxiliary memory 11c.

Figure 5:
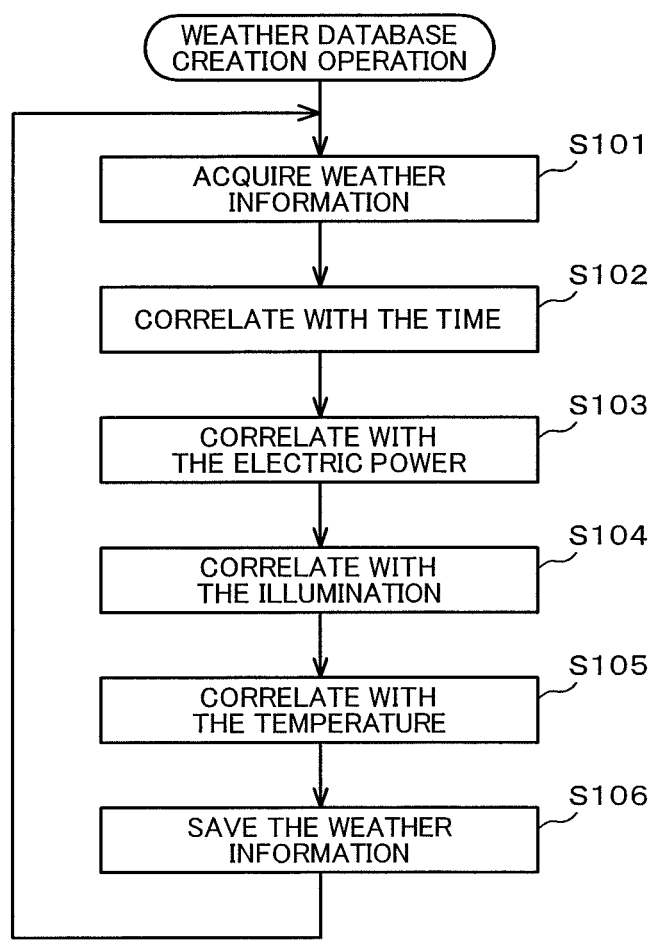
FIG. 5 is a flowchart for explaining a weather database creation operation.

FIG. 5 is a flowchart illustrating the series of processes that are executed by the CPU 11a when creating a weather database. The series of processes illustrated in FIG. 5 is executed after the operation support system 10 has been activated.

First, the CPU 11a acquires weather information WR1 for the current weather by way of the Internet 90 (step S101). Then, the CPU 11 correlates the weather information WR1 with the time at which that weather information WR1 was acquired (step S102).

Next, the CPU 11a receives signals W1, $W2_1$ to $W2_4$, W3 that are outputted from the electric power meters 31, 40, 61. The CPU 11a then correlates the weather information WR1, electric power P1 that is supplied to the house 100, the electric power $P2_1$ to $P2_4$ that is consumed by the electrical equipment $50_1$ to $50_4$, and the electric power P3 that is generated by the electric power generator 60 (step S103).

Next, the CPU 11a receives signals $L_1$ to $L_2$ that are outputted from the illumination sensors 32. The CPU 11a then correlates the weather information WR1 with the illumination intensity LX1 to LX4 of the rooms 101 to 103 and the common area 104 (step S104).

Next, the CPU 11a receives signals $TH_1$ to $TH_4$ that are outputted from the temperature sensors 33. The CPU 11a correlates the weather information WR1 with the temperature TH1 to TH4 of the rooms 101 to 103 and the common area 104 (step S105).

Next, the CPU 11a saves the weather information WR1, which is correlated with the time information for the time at which the weather information was acquired, the electric power information and the illumination information and the temperature information in the auxiliary memory 11c (step S106). After the processing of step S106 ends, the CPU 11a returns to step S101, and then repeats the processing of steps S101 to S106. As a result, a weather database such as illustrated in FIG. 6 is created as an example.

The most updated weather database is automatically displayed on the display device 13. FIG. 7 is a drawing illustrating a weather database that is displayed on the display device 13. As illustrated in FIG. 7, the weather database is such that the power consumed by the house 100 is displayed in 1-hour units. Moreover, together with the power consumption, the electricity cost Y per hour is also displayed. Similarly, together with the power consumption per hour of the rooms 101 to 103 and the common area 104 being displayed, the electricity costs Y1 to Y4 per hour are displayed. These electricity costs are calculated based on the electric power contract for the house 100.

Moreover, when displaying the weather database, the user 130 can also display the illumination intensity and the temperature in each of the rooms 101 to 103 and the common area 104 as illustrated in FIG. 8, for example.

Figure 9:
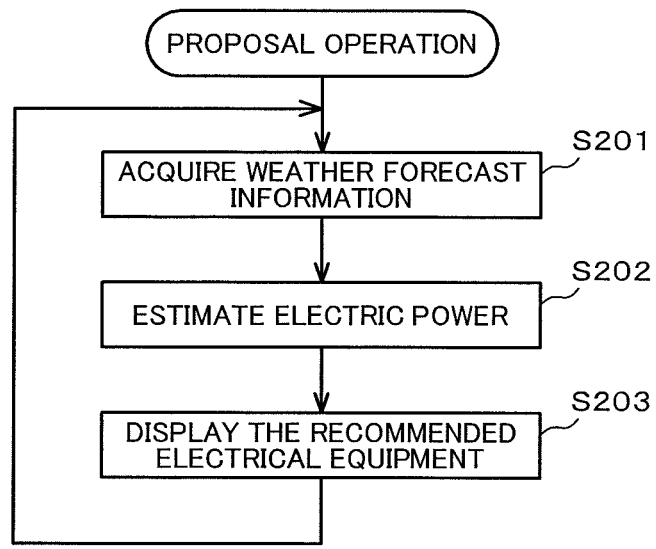
FIG. 9 is a flowchart for explaining a proposal operation.

Next, the proposal operation that is executed by the control device 11 will be explained with reference to the flowchart in FIG. 9. The series of processes illustrated in FIG. 9 is executed after the operation support system 10 has been activated.

First, the CPU 11a acquires forecast information WR2 related to the weather forecast by way of the Internet 90 (step S201). Next, the CPU 11a predicts the amount of electric power that will be consumed by the electrical equipment 50 during weather that corresponds to the forecast information WR2 (step S202).

Figure 10:
FIG. 10 is a drawing illustrating the correlation between estimated information values and average electric power values.

For example, when the contents of the forecast information WR2 is "the weather will be fine in one hour", the CPU 11a references the weather database illustrated in FIG. 6, and calculates the average values $P2_1(AVG)$ to $P2_4(AVG)$ of the electric power $P2_1$ to $P2_4$ that is consumed by the electrical equipment $50_1$ to $50_4$. Then as illustrated in FIG. 10, the CPU 11a correlates the average values $P2_1(AVG)$ to $P2_4(AVG)$ with the forecast information WR2 as the estimated amount of power consumption by electrical equipment 50 that corresponds to the forecast information WR2. The CPU 11a performs the processing described above for forecast information WR2 that can be acquired. For example, when the forecast information WR2 that can be acquired is for 1 to 3 hours from the current time, then as illustrated in FIG. 11, the CPU 11a calculates the average values $P2_1(AVG)$ to $P2_4(AVG)$ of each forecast information WR2.

After calculating the average values $P2_1(AVG)$ to $P2_4(AVG)$ of each forecast information WR2, the CPU 11a displays the calculation results on the display device 13. Then, by highlighting the display of the minimum average among the average values $P2_1(AVG)$ to $P2_4(AVG)$, the electrical equipment 50 that is the most suitable for operation is indicated to the user 130 (step S203).

FIG. 12 is a drawing illustrating the calculation results by the CPU 11a that are displayed on the display device 13. As can be seen from FIG. 12, the minimum average value among the average values $P2_1(AVG)$ to $P2_4(AVG)$ is highlighted on the display device 13 by using a rectangular frame. Therefore, the user 130 is able to, by way of the input device 12, efficiently operate the electrical equipment by scheduling the operation of the electrical equipment that corresponds to the highlighted average values.

For example, as illustrated in FIG. 12, when the calculation results are displayed on the display device 13, the user 130 is able to see that by operating the electrical equipment $50_1$ in one hour, operating the electrical equipment $50_2$ in two hours and operating the electrical equipment $50_4$ in three hours, the power consumption becomes a minimum and the electricity cost becomes less.

After the processing of step S203 ends, the CPU 11a returns to step S201, and after that repeatedly executes the processing of steps S201 to S203.

Moreover, in this embodiment, the user 130 is able to perform scheduling by way of the input device 12 so that in one hour the electrical equipment $50_1$ operates, in two hours the electrical equipment $50_2$ operates and in three hours the electrical equipment $50_4$ operates. When it is time to start operation of the scheduled electrical equipment, the control device 11 that received the scheduling from the user 130 instructs the communication device 14 to send an e-mail in order to notify, the user 130 that the time has come. As a result, the e-mail is sent to the user 130.

For example, in the case when the user 130 has scheduled to operate the electrical equipment $50_1$ in one hour, after the time elapses one hour from the time of scheduling, an e-mail prompting to operate the electrical equipment $50_1$ is sent to the user 130.

As was explained above, in this embodiment, the total electric power P1 that is supplied to the house 100, the electric power $P2_1$ to $P2_4$ that is consumed by the electrical equipment $50_1$ to $50_4$ that is used in the house 100, and the electric power P3 that is generated by the electric power generator 60 are automatically displayed together with the weather information WR1 that indicates the weather every hour. As a result, the user 130 is able to see the amount of electric power that is consumed by the electrical equipment 50 according to the weather, and the amount of electric power that is generated by the electric power generator 60 according to the weather. Therefore, it becomes possible to efficiently operate the electrical equipment according to the weather.

In this embodiment, the electricity cost for the total electric power P1 that is supplied to the house 100, and the electricity cost for the electric power $P2_1$ to $P2_4$ that is consumed by the electrical equipment $50_1$ to $50_4$ that is used in the house 100 are automatically displayed together with the weather information WR1 that indicates the weather for every hour. As a result, the user 130 is able to check the relationship between the weather and the electricity cost. Therefore, it becomes possible to efficiently operate the electrical equipment according to the weather.

In this embodiment, the total electric power P1 that is supplied to the house 100, the electric power $P2_1$ to $P2_4$ that is consumed by the electrical equipment $50_1$ to $50_4$ that is used in the house 100, and the electric power P3 that is generated by the electric power generator 60 are automatically displayed together with the temperature or illumination intensity of the rooms 101 to 103 and common area 104. Therefore, the user 130 is able to check the relationship between the temperature or illumination and the power consumption. Consequently, it becomes possible to efficiently operate the electrical equipment 50 according to the weather.

In this embodiment, after weather forecast information WR2 has been acquired, average values $P2_1(AVG)$ to $P2_4(AVG)$ of the power consumed by the electrical equipment $50_1$ to $50_4$ during the weather indicated by that forecast information WR2 are calculated and displayed. These average values $P2_1(AVG)$ to $P2_4(AVG)$ of the consumed power are considered to be correlated with estimated values for the amount of electric power consumed by the electrical equipment 50 during the weather indicated by the forecast information WR2. Therefore, the user 130 is able to perform efficient operation of the electrical equipment 50 according to the changes in the future weather.

In this embodiment, the user 130, by way of the input device 12, is able to perform scheduling of electrical equipment 50 that will operate in the future. Then, when it is time to start operation of the scheduled electrical equipment 50, the control device 11 that received the scheduling from the user 130 instructs the communication device 14 to send an e-mail in order to notify the user 130 that the time has come. As a result, the e-mail above is sent to the user 130. Therefore, the user 130 is able to operate the electrical equipment 50 without forgetting.

An embodiment of the present invention was explained above; however, the present invention is not limited to the embodiment above. For example, in the embodiment above, forecast information WR2 and the average amount of electric power consumed by each of the electrical equipment 50 were displayed as illustrated in FIG. 12. The present invention is not limited to this, and it is also possible, as illustrated in FIG. 13, for the display device 13 to display the electricity coat required for operating each of the electrical equipment 50.

In this embodiment, the total electric power P1 that is supplied to the house 100, the electric power $P2_1$ to $P2_4$ that is consumed by the electrical equipment $50_1$ to $50_4$ that is used in the house 100, and the electric power P3 that is generated by the electric power generator 60 were respectively measured using the electric power meter 40, the electric power meters $31_1$ to $31_4$, and the electric power meter 61. However, the invention is not limited to this, and when it is difficult to install the electric power meters $31_1$ to $31_4$ for measuring the electric power that is supplied to the rooms 101 to 103 and common area 104, it is possible to identify the electrical equipment 50 that is operating and the consumed power based on the harmonic component of the current that is flowing on the lead-in wire 110 of the house 100.

In the embodiment above, when it becomes time to start operating the scheduled electrical equipment 50, an e-mail was sent to notify of the time. However, the invention is not limited to this, and it is also possible for the communication device 14 to send a telephone message to the user 130.

The function of the control device 11 of the embodiment described above can be achieved by special hardware, or can also be achieved by a normal computer system.

For example, a program that is stored in the auxiliary memory 11c can be stored and distributed on a computer readable medium such as a flexible disk, a CD-ROM (Compact Disk Read-Only-Memory), a DVD (Digital Versatile Disk), a MO (Magneto-Optical disk) and the like; and by installing that program onto a computer, it is possible to construct a device that executes the processing described above.

The program can also be stored on a disc device of a specified server device on a communication network such as the Internet, and can be superimposed on a carrier wave and downloaded to a computer.

Moreover, it is possible to achieve the processing described above by activating and executing the processing while transferring the program by way of a communication network.

Furthermore, it is also possible to achieve the processing described above by executing all or part of the program on a server device, and executing the program while a computer transmits and receives information related to that processing by way of a communication network.

In the case where the functions described above are achieved by the OS (Operating System) sharing the functions, or by the OS and applications working together, it is possible to store and distribute only the portions other than the OS on a medium, or it is possible to download those portions to a computer.

Moreover, the method for achieving the functions of the CPU 11a is not limited to software, and all or part of those functions can be achieved by special hardware (circuits, or the like).

Various embodiments and variations of the present invention are possible without departing from the broad spirit and range of the invention. Moreover, the embodiments described above are for explaining the present invention and do not limit the range of the claims. In other words, the range of the present invention is as presented in the claims and not the embodiments. Variations that are within the range of the claims, or that are within a range that is equivalent in significance to that of the present invention are considered to be within the range of the present invention.

The operation support device and program of the present invention are applied to the support of operation of electrical equipment that is installed in a house.

EXPLANATION OF REFERENCE NUMBERS

10 Operation support system
11 Control device
11a CPU
11b Main memory
11c Auxiliary memory
11d Interface
11e System bus
12 input device
13 Display device
14 Communication device
17 System bus
31 Electric power meter
32 Illumination sensor
33 Temperature sensor
40 Electric power meter
50 Electrical equipment
60 Electric power generator
61 Electric power meter
90 Internet
100 House
101 Room
102 Room
103 Room
104 Common area
110 Lead-in wire
110a to 110e Branch wires
130 User

What is claimed is:

1. An operation support system that supports the operation of a plurality of pieces of electrical equipment in a house, comprising:
a weather information acquirer that acquires hourly weather information by way of a network;
a detector that detects a state of use of the plurality of pieces of electrical equipment that are used by a user living in the house;
a memory that stores the weather information and the state of use of the plurality of pieces of electrical equipment that have been correlated over time;
an identifier that (i) refers to the memory, (ii) calculates hourly predicted power consumption in a future of the plurality of pieces of electrical equipment based on the state of use of the plurality of pieces of electrical equipment correlated with the hourly weather information in a past that matches with the hourly weather information in the future acquired by the weather information acquirer, and (iii) identifies the plurality of pieces of electrical equipment suitable for the operation from among the plurality of pieces of electrical equipment so that electricity cost becomes minimum; and a display that displays (i) the weather information and the state of use of the plurality of pieces of electrical equipment that are stored in the memory, and (ii) identification results of the identifier.

2. The operation support system according to claim 1, wherein the memory stores the weather information, and power consumption of the plurality of pieces of electrical equipment that have been correlated over time.

3. The operation support system according to claim 1, wherein the display displays the electricity cost of the plurality of pieces of electrical equipment based on an electric power contract of a facility where the plurality of pieces of electrical equipment are installed.

4. The operation support system according to claim 3, wherein the display displays an hourly electricity cost.

5. The operation support system according to claim 1, wherein the display displays the electricity cost when the plurality of pieces of electrical equipment that were identified by the identifier are used.

6. The operation support system according to claim 1, comprising:

an interface for the user to input a schedule for operating the plurality of pieces of electrical equipment; and a notifier for notifying the user of a timing for operating the plurality of pieces of electrical equipment based on the schedule.

7. A non-transitory recording medium on which is recorded a program for causing a computer to function as:

a weather information acquirer that acquires hourly weather information by way of a network;

a memory that stores the weather information and a state of use of a plurality of pieces of electrical equipment used by a user living in the house that have been correlated over time;

an identifier that (i) refers to the memory, (ii) calculates hourly predicted power consumption in a future of the plurality of pieces of electrical equipment based on the state of use of the plurality of pieces of electrical equipment correlated with the hourly weather information in a past that matches with the hourly weather information in the future acquired by the weather information acquirer, and (iii) identifies the plurality of pieces of electrical equipment suitable for the operation from among the plurality of pieces of electrical equipment so that electricity cost becomes minimum; and a display that displays (i) the weather information and the state of use of the plurality of pieces of electrical equipment that are stored in the memory, and (ii) identification results of the identifier.

* * * * *